(12) United States Patent
Cabauy et al.

(10) Patent No.: US 10,978,215 B2
(45) Date of Patent: Apr. 13, 2021

(54) SERIES AND/OR PARALLEL CONNECTED ALPHA, BETA, AND GAMMA VOLTAIC CELL DEVICES

(71) Applicant: City Labs, Inc., Homestead, FL (US)

(72) Inventors: Peter Cabauy, Miami, FL (US); Larry C. Olsen, Kennewick, WA (US); Bret J. Elkind, Homestead, FL (US); Jesse Grant, Homestead, FL (US)

(*) Notice: Subject to any disclaimer, the term of this patent is extended or adjusted under 35 U.S.C. 154(b) by 711 days.

(21) Appl. No.: 15/602,078

(22) Filed: May 22, 2017

(65) Prior Publication Data

US 2017/0358377 A1    Dec. 14, 2017

Related U.S. Application Data

(60) Provisional application No. 62/339,943, filed on May 22, 2016.

(51) Int. Cl.
  *G21H 1/06*    (2006.01)
  *H01L 31/0304*    (2006.01)

(52) U.S. Cl.
  CPC ......... *G21H 1/06* (2013.01); *H01L 31/03046* (2013.01)

(58) Field of Classification Search
  CPC .......................... G21H 1/06; H01L 31/03046
  USPC ....................................................... 310/303
  See application file for complete search history.

(56) References Cited

U.S. PATENT DOCUMENTS

| | | | | |
|---|---|---|---|---|
| 3,706,893 A | * | 12/1972 | Olsen | G21H 1/06 310/303 |
| 8,487,392 B2 | * | 7/2013 | Spencer | H01L 31/115 257/428 |
| 8,487,507 B1 | * | 7/2013 | Cabauy | G21H 1/06 310/301 |
| 9,099,212 B2 | * | 8/2015 | Thomas | G21H 1/06 |
| 9,799,419 B2 | * | 10/2017 | Cabauy | G21H 1/06 |
| 10,186,339 B2 | * | 1/2019 | Cabauy | H01L 31/1892 |
| 10,431,345 B2 | * | 10/2019 | Cabauy | A61N 1/3787 |
| 2008/0199736 A1 | * | 8/2008 | Gadeken | G21H 1/06 429/5 |
| 2008/0200628 A1 | * | 8/2008 | Gadeken | C07B 59/00 526/279 |

(Continued)

*Primary Examiner* — Tulsidas C Patel
*Assistant Examiner* — Ahmed Elnakib
(74) *Attorney, Agent, or Firm* — Wolter Van Dyke Davis, PLLC; John L. DeAngelis

(57) ABSTRACT

A device for producing electricity. The device includes a substrate having spaced apart first and second surfaces and doped a first dopant type, first semiconductor material layers disposed atop the first substrate surface and doped the first dopant type, and second semiconductor material layers disposed atop the first semiconductor material layers and doped a second dopant type. A first contact is in electrical contact with the second substrate surface or in electrical contact with one of the first semiconductor material layers. A beta particle source emits beta particles that penetrate into the semiconductor material layers; the beta particle source is proximate the uppermost layer of the second plurality of semiconductor material layers. A second contact is in electrical contact with one of the second plurality of semiconductor material layers. In one embodiment, bi-polar contacts (the first and second contacts) are co-located on each major face of the device.

21 Claims, 15 Drawing Sheets

(56) References Cited

U.S. PATENT DOCUMENTS

| | | | |
|---|---|---|---|
| 2009/0026879 A1* | 1/2009 | Prelas | G21H 1/06 |
| | | | 310/303 |
| 2017/0358377 A1* | 12/2017 | Cabauy | G21H 1/06 |
| 2018/0108446 A1* | 4/2018 | Cabauy | H01L 31/02161 |
| 2019/0228872 A1* | 7/2019 | Cabauy | G21H 1/06 |
| 2020/0279666 A1* | 9/2020 | Cabauy | H01L 31/03046 |

* cited by examiner

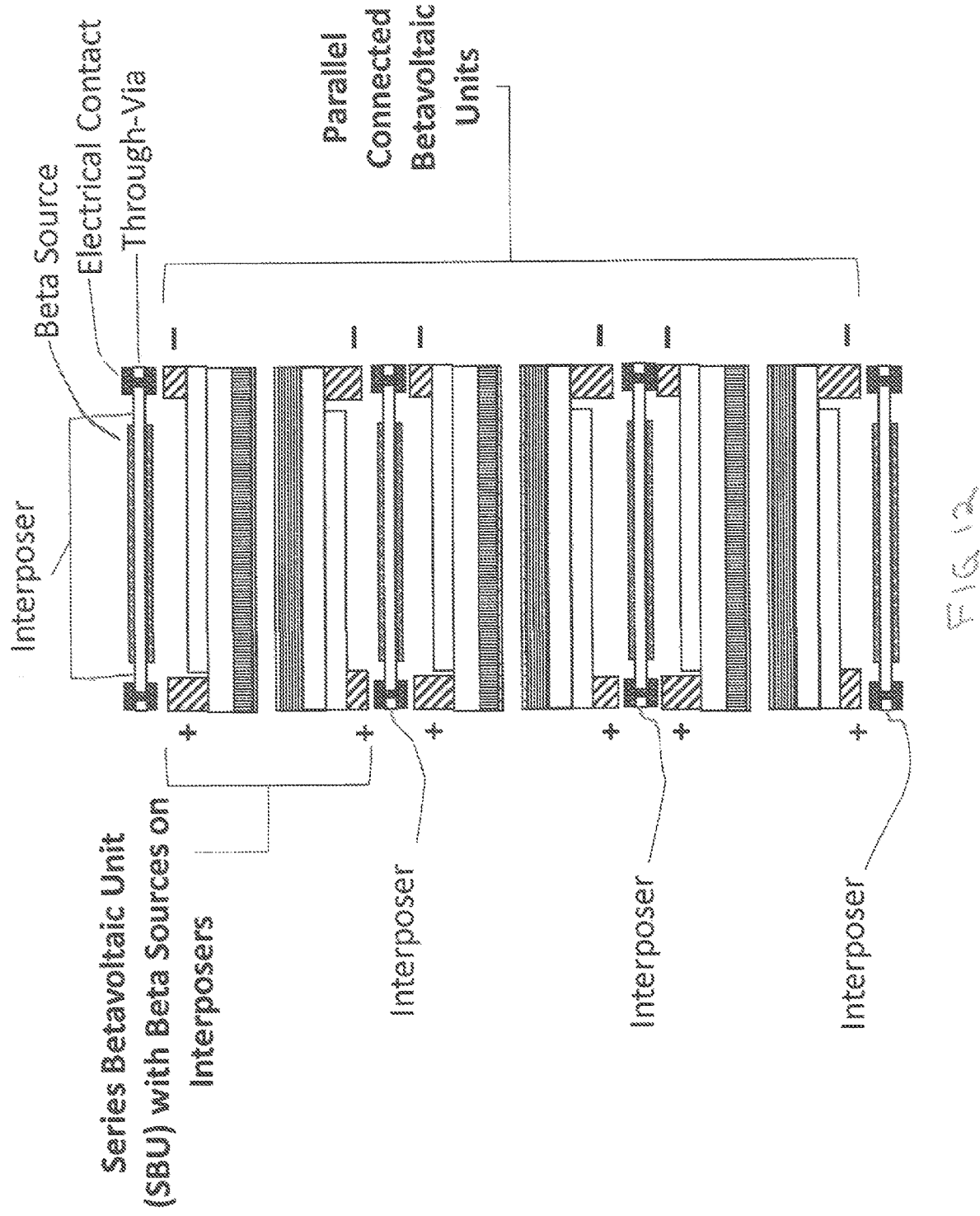

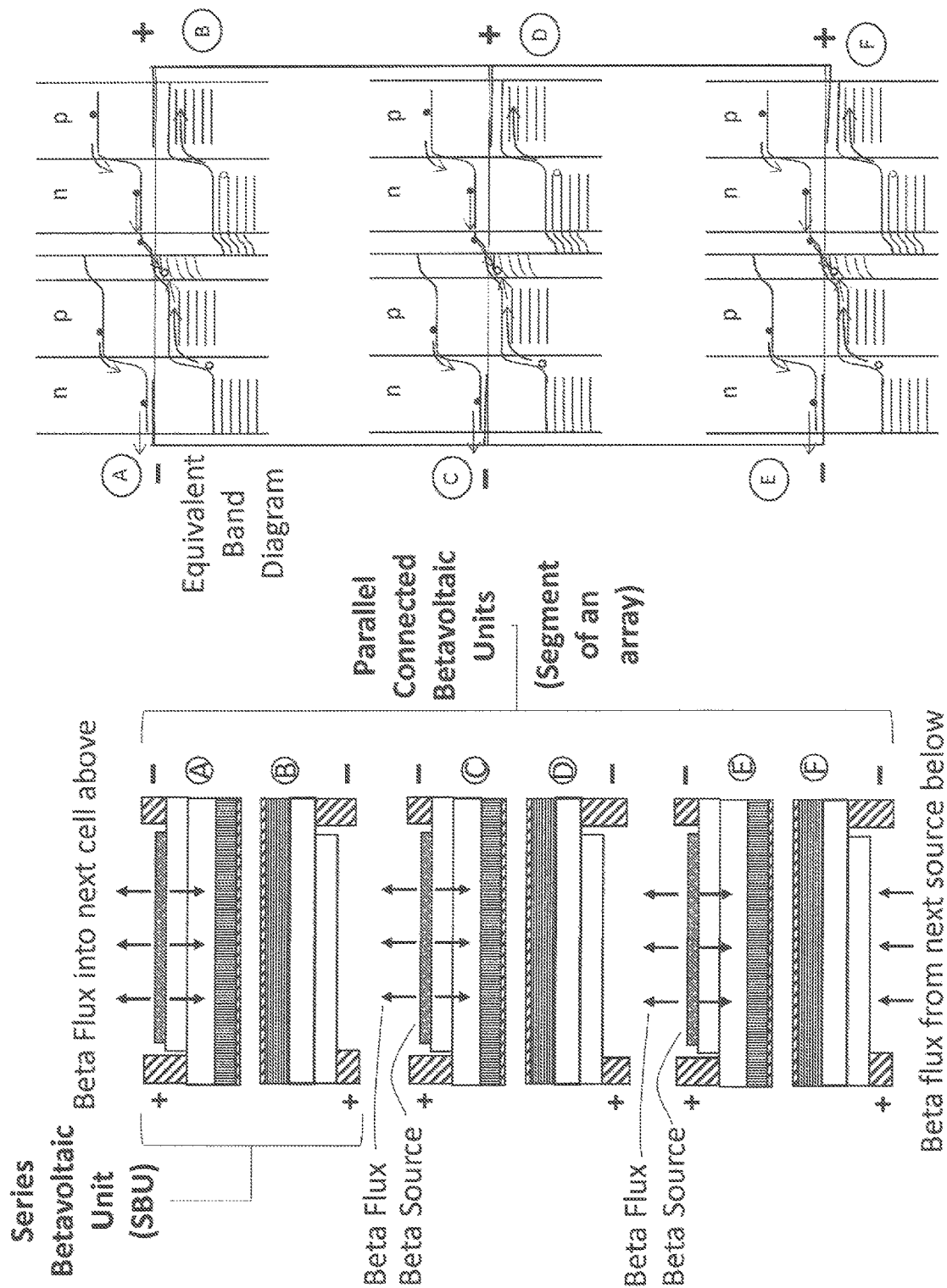

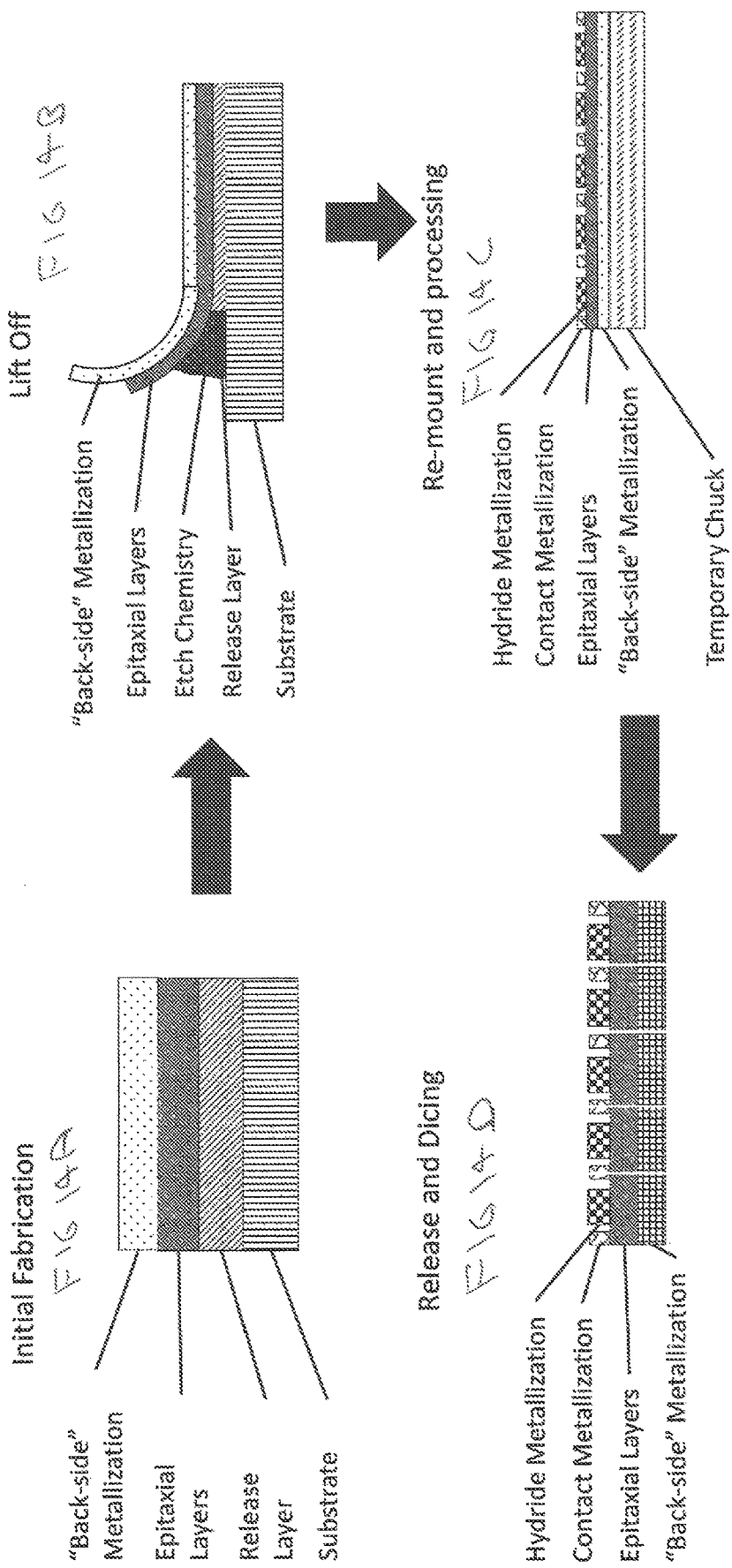

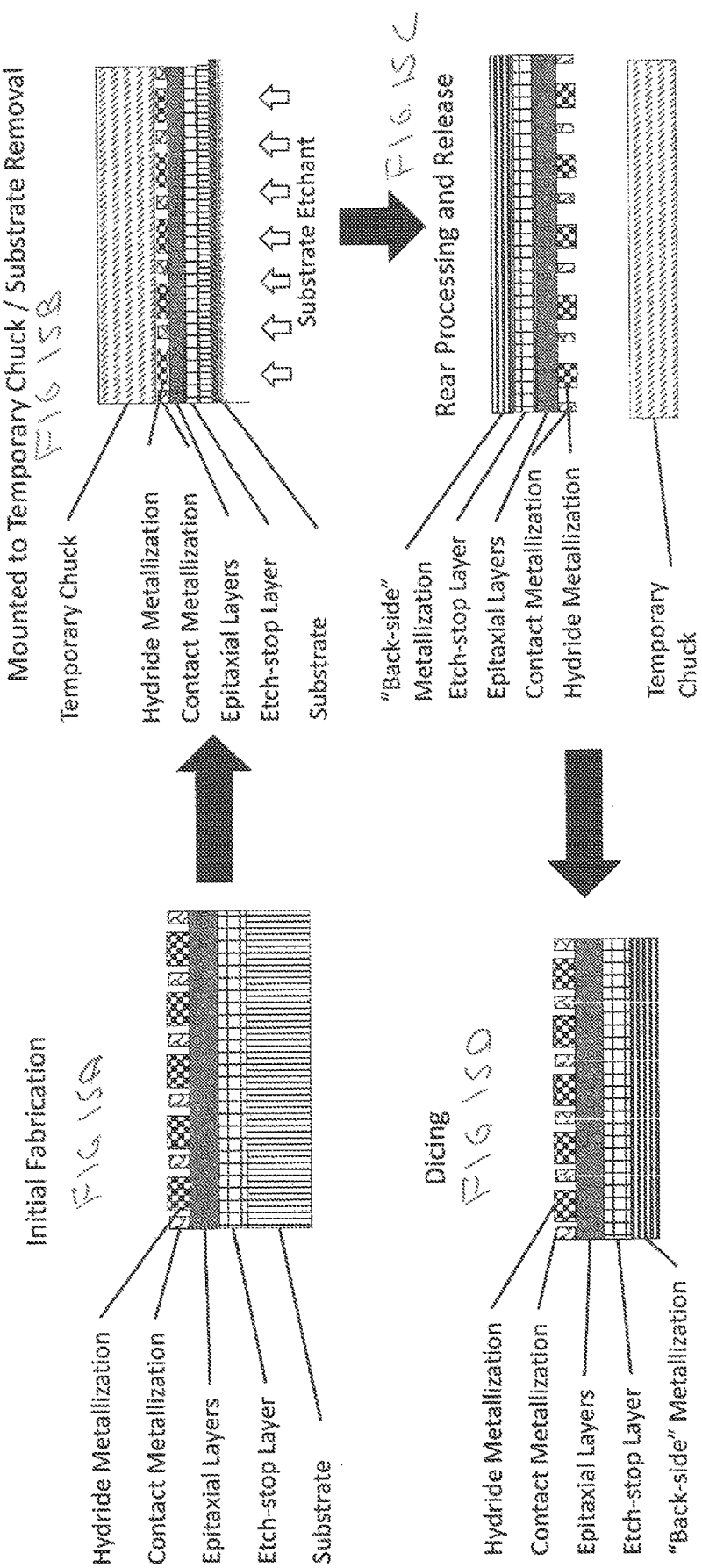

SERIES AND/OR PARALLEL CONNECTED ALPHA, BETA, AND GAMMA VOLTAIC CELL DEVICES

CROSS REFERENCE TO RELATED APPLICATIONS

The present invention claims priority under 35 U.S.C. 119(e) to the provisional patent application filed on May 22, 2016 and assigned application No. 62/339,943. This provisional patent application is incorporated in its entirety herein.

BACKGROUND OF THE INVENTION

The direct conversion of radioisotope beta (electron) emissions into usable electrical power via beta emissions directly impinging on a semiconductor junction device was first proposed in the 1950's. Incident beta particles absorbed in a semiconductor create electron-hole-pairs (EHPs) that are accelerated by the built-in field to device terminals, and result in a current supplied to a load. These devices are known as Direct Conversion Semiconductor Devices, Beta Cells, Betavoltaics, Betavoltaic Devices, Betavoltaic Power Sources, Betavoltaic Batteries, Isotope Batteries etc.

These direct conversion devices promise to deliver consistent long-term power for decadal time periods. For this reason, many attempts have been made to commercialize such a device. However, in the hopes of achieving reasonable power levels, the radioisotope of choice often emitted unsafe amounts of high energy radiation that would quickly degrade either semiconductor device properties within the betavoltaic battery or the surrounding electronic devices powered by the betavoltaic. The radiated energy may also be harmful to operators in the vicinity of the device.

As a result of these disadvantages, and in an effort to gain approval from nuclear regulatory agencies for these types of devices, the choice for radioisotopes has been limited to low-energy beta (electron) emitting radioisotopes, such as nickel-63, promethium-147, or tritium. Due to the less aggressive nature of these candidate radioisotopes, their concomitant lower power density necessitates compactly configured assemblies of the radioisotope source/semiconductor junctions (betavoltaic cells) in order to provide higher power density betavoltaic devices sought by industry.

Compact and cost-efficient series and parallel connection of betavoltaic cells are extremely important to the advancement and state-of-the-art of betavoltaic power sources. Indicated in K. Bower's book entitled "Polymers, Phosphors, and Voltaics for Radioisotope Microbatteries", It is well known to those skilled in the art that rudimentary stacked series connection of betvoltaic cells produce volumetrically power dense arrangements; however, efficient stacked parallel connected betavoltaic cells continue to be sought by industry.

Similarly, the following patents have attempted to invoke a variety of stacking solutions for efficient parallel interconnections:

U.S. Pat. No. 3,706,893
U.S. Pat. No. 8,487,507
U.S. Pat. No. 8,487,392
U.S. Pat. No. 9,099,212

Common to all of these efforts is the use of conductive traces, wires, insulators, through-vias, interposers, and other interconnection methods known in the integrated circuit (IC) industry. Unfortunately, these methods embody limitations of conventional IC industry's common practices and are not conducive to the betavoltaic industry's demand for devices with increasing power production. The challenges to the conventional series/parallel interconnects for betavoltaic cells is removal of volumetrically inefficient interconnect components in order to make better use of volumetric space, increase power density, and reduce the cost of manufacturing. Unlike its solar photovoltaic counterpart, it is also beneficial to remove some of these components as their presence can reduce efficiency and degrade power performance of betavoltaic cells.

For example, typical through-vias, which extend completely through a semiconductor substrate, as described in U.S. Pat. No. 9,099,212, are deleterious to the semiconductor performance in a betavoltaic device due to reduction in active area and creation of defects in the betavoltaic semiconductor's lattice around the boundary of each via. In addition, through-vias are costly in terms of processing equipment and time. Vias are typically on the order of tens to hundreds of microns in diameter and are typically produced with an aspect ratio of 15:1. Vias therefore are comparatively costly in terms of the area they occupy on the cell.

In addition to occupying a larger physical space on the cell, the process of creating vias through laser ablation or plasma etching of the wafer can leave a large swath of area around the via that is unsuitable for betavoltaic use. Vias formed prior to the growth of semiconductor regions act as significant areas for losses through recombination, and vias that are created after growth destroy already-established junction area. Furthermore, through-via reliability is traditionally low; therefore, multiple through via structures are required to improve device performance. Similarly, other components such as conductive traces, wires, insulators, interposers, and other interconnection methods also add cost and are volumetrically and power-density inefficient for stacking betavoltaic cells.

It is also known to use surface roughness techniques to increase the area of the semiconductor and its concomitant power density of betavoltaic cells, but these techniques commonly lead to increased dark current and lowered efficiency.

These disparate elements increase the power density of betavoltaic cells and more importantly the total power of stacking arrangements; however, even with these optimizations the stacking of betavoltaic cells still requires the use of interposers, wires, solder bumps, flexible wires, wire bonds, and/or through-vias etc. These types of interconnection of cells can be costly to produce and reduce the power density significantly.

DESCRIPTION OF THE FIGURES

FIG. 12 illustrates an embodiment where the beta source is disposed on an interposer layer.

FIG. 13A illustrates an embodiment of a series betavoltaic unit with a dual-directed beta flux and FIG. 13B illustrates a band diagram of the embodiment of FIG. 13A.

FIGS. 14A-14D illustrate steps associated with an epitaxial lift-off (ELO) process.

FIGS. 15A-15D illustrate steps associated with a substrate removal process.

DESCRIPTION OF THE INVENTION

Figure 1:
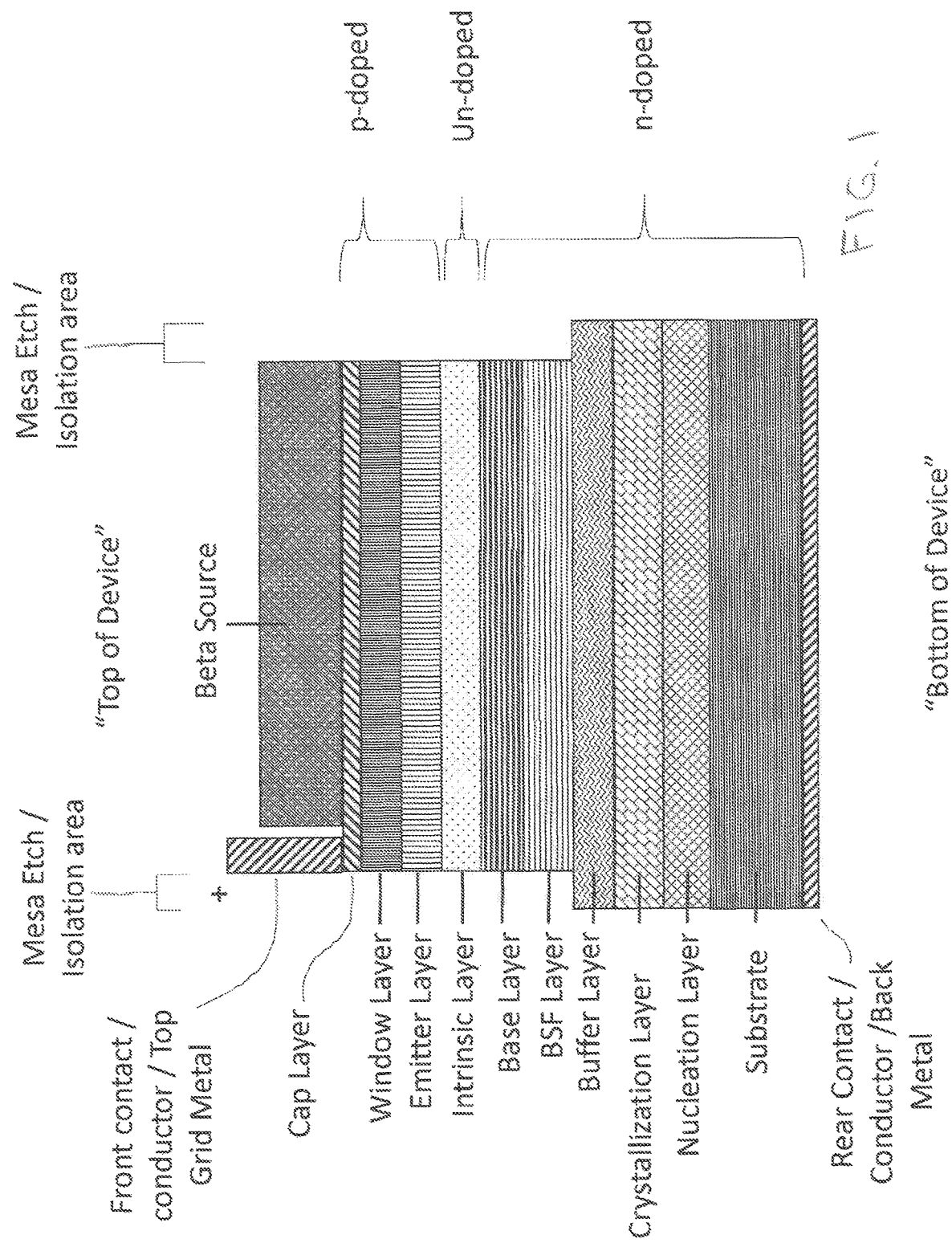
FIGS. 1-3 illustrate different embodiments with different contact configurations for a betavoltaic device.

The present invention implements configurations and structures for use in creating series and/or parallel stacked betavoltaic cell devices that are both easy to manufacture, and that can be utilized across all betavoltaic junction materials (e.g. III-V materials, silicon, germanium, silicon carbide, diamond, etc.).

The push for higher power and energy density betavoltaics means that every facet of a betavoltaic system needs to be optimized. Commonly-owned U.S. Pat. No. 8,487,507 (entitled Tritium Direct Conversion Semiconductor Device) describes a method for optimizing semiconductor materials by making the substrate extremely thin or by using an epi-layer lift-off (ELO) process. This same patent describes a method for surface deposition of a thin metal tritide material directly on the surface of the semiconductor.

Solar photovoltaic cells typically have opposing polarity contacts on the top and bottom surfaces of the cell; these cells are arranged in large areal, planar arrays in order to increase power production through maximized exposure to incoming incident light.

In contrast, betavoltaics generate power by exposure to a radioisotope source and may be arranged in a comparatively denser volumetric configuration (e.g. repeating layers of stacked, or rolled semiconductor and radioisotope sources). Such a compact structure invariably leads to a requirement for compact series and parallel interconnection schemes for semiconductor cell components inside of a betavoltaic device.

According to one aspect of the present invention, the physical and electrical arrangement of cells in a dense configuration is accomplished by introducing electrical connections of opposing polarities on both the front and the back of a single cell, or a "unit" of cells, and subsequently stacking those cells or units in a layered array (e.g. a vertical stack). Maximum benefit from this physical arrangement is ideally achieved when interconnection is made without the use of interposers, inert substrates, vias, or any material that is not required or desired for the basic betavoltaic cells and radioisotope sources. The introduction of these novel contact arrangements and structures permits the connection of cells, or units of cells, in either series or parallel configurations when stacked physically in a layered vertical (or horizontal) configuration.

As is known in the art, a basic arrangement of p-type and n-type elements (e.g. in a vertical arrangement) would be p/n-p/n-p/n . . . with a first contact on an n-type layer and a second contact on a p-type layer and a beta source for each p/n junction. This arrangement necessarily places the betavoltaic device in an electrically stacked series configuration. In many applications, a series combination of a large number of betavoltaic cells is unfavorable; such an arrangement creates a device generating a relatively high voltage and low current.

One embodiment of the present invention, teaches bi-polar (positive and negative) contacts on both the top and bottom surfaces of the betavoltaic cells, or unit of cells, to easily permit parallel (as well as series) stacked/layered configurations, producing better tunability of voltage and current in volumetrically compact form factors that are cost effective to manufacture.

Betavoltaic cells are described generally in: commonly owned U.S. Pat. No. 8,487,507 (entitled Tritium Direct Conversion Semiconductor Device U.S. Pat. No. 9,466,401 (entitled Tritium Direct Conversion Semiconductor Device, commonly-owned US patent application assigned application Ser. No. 15/286,567, filed on Oct. 6, 2016, and entitled Tritium Direct Conversion Semiconductor Device, and commonly-owned US patent application assigned application Ser. No. 14/623,861, filed on Feb. 17, 2015, and entitled Tritium Direct Conversion Semiconductor Device for Use with Gallium Arsenide or Germanium Substrates. These patents and patent applications are incorporated herein. Other commonly owned and subsequently filed commonly-owned patent applications describe betavoltaic cells and are incorporated herein. One inventive feature of the present invention related to the location of bi-polar contacts and the structural features that make this feature available can be applied generally to any of these betavoltaic cells.

In a typical betavoltaic semiconductor, there are a plurality of layers comprising potentially different materials and dopant levels that comprise the p-type regions of a device, and a plurality of layers with potentially different materials and dopant levels that make up the n-type regions of the device. FIG. 1 illustrates a betavoltaic cell with electrical contacts and a beta-emitting source comprising such a plurality of layers and with the dopant type (or undoped) as shown for each layer. The base and emitter layers are the principal functional layers, while the window layer serves to reflect minority carriers (electrons) in that region and prevent recombination. The intrinsic layer separates the base and emitter layers and the BSF (back surface field reflector) layer reflects minority carriers (holes) in that region back toward the base layer.

Other layers serve various functional roles; the cap layer protects the window layer from oxidation and provides a surface to establish electrical contacts. The nucleation layer is used to establish an interfacial surface upon which successive layers may be grown with proper crystallographic orientation. The crystallization layer establishes clean, defect-free growth for successive layers. The buffer layer is used as an intermediary layer to help in the transition to subsequent layers.

Certain embodiments may include additional or other layers not shown in FIG. 1 that serve particular purposes for processing or function of the device (e.g., etch stop, release layers, buffer layers, etc.). Other embodiments may eliminate one or more of the layers shown in FIG. 1.

The substrate layer is typically germanium or gallium arsenide, but may be gallium phosphide, silicon, or any material that can receive the proper nucleation and subsequent growth layers. Typical substrates range from approximately 100 microns or less to 1000 microns or thicker. The substrate may be thinned, either chemically, mechanically, or through other methods known in the art, or the substrate may be removed entirely as in the case of ELO techniques and other substrate removal techniques as is known in the art. In certain cases, (e.g., ELO or substrate removal) the substrate may be doped, undoped, or insulating.

A betavoltaic device can be created with a simple p/n junction consisting of just two functional layers; however, an efficient device employs a combination of the layers and techniques described and deliberately engineered for performance benefits.

A functioning device can also be fabricated by reversing the dopant types from the dopant types shown in FIG. 1. That is, n-type doped materials become p-type, and similarly, p-type materials become n-type. The reversing of dopant types does not impact the function of the device, and only schematically changes the direction of current flow (the polarity), whereby positive terminals become negative terminals and so forth.

Beta-radiation (or other electron-producing methods via a radioisotope) emitted from candidate radioisotopes e.g. tritium, nickel-63, promethium-147, (referred to as a beta source in FIG. 1) that would be used in most betavoltaic devices has a very short mean free path in the betavoltaic junction; therefore, semiconductor junctions and materials used in a betavoltaic need not be very thick, e.g. tens of µm or less.

In FIG. 1, positive contact is disposed atop the doped cap layer. These described layers are formed on a doped substrate and a negative conductor is connected to a bottom surface of the substrate. In order to create these efficient current-collecting terminals/contacts/conductors, one contact must be made to a p-type element or layer and another contact to an n-type element or layer. A potential difference thus exists between the contacts; when the contacts are connected to a load, a current flows through the load.

The contacts can be formed through evaporation, sputtering, plating, atomic layer deposition, and/or other physical or chemical deposition processes as well as through the use of epoxies, solders, or conductive pastes or other materials and techniques known in the art.

Masking of certain regions for the metallization process can be accomplished through the use of hard masks, lithography, shadow masks, and/or direct writing.

Contacts may be formed with material that is type-compatible with the semiconductor material (i.e., n-type compatible contacts with n-type layers only, and p-type compatible contacts with p-type layers only), and this typically is accomplished with "grid metal or emitter metal" making contact to elements on the "top" of a device, and "back metal or back surface metallization" making contact to elements on the "bottom" or opposite side of the same device as shown in FIG. 1.

Further details of the structure, configuration, and operation of these layers are described in one or more of the following commonly-owned patent references, which are incorporated by reference herein:

U.S. Pat. No. 9,466,401 issued on Jun. 24, 2013 and entitled Tritium Direct Conversion Semiconductor Device.

U.S. Pat. No. 8,487,507 issued on Jul. 16, 2013 and entitled Tritium Direct Conversion Semiconductor Device.

U.S. Pat. No. 8,634,201 issued on Jan. 21, 2014 and entitled Radioisotope Power Source Package for Microelectronics.

U.S. Published patent application Ser. No. 14/313,953 filed on Jun. 24, 2014 and entitled Tritium Direct Conversion Semiconductor Device Having Increased Surface Area.

U.S. Published patent application Ser. No. 14/623,861 filed on Feb. 17, 2015 and entitled Tritium Direct Conversion Semiconductor Device For Use With Gallium Arsenide or Germanium Substrates.

U.S. Provisional Patent Application No. 62/396,185 filed on Sep. 18, 2016 and entitled Tritium Thermoelectric Generator.

U.S. patent application Ser. No. 15/286,567 filed on Oct. 6, 2016 and entitled Tritium Direct Conversion Semiconductor Device.

U.S. Provisional Patent Application No. 62/435,907 filed on Dec. 19, 2016 and entitled Binary Intermetallic Hydrides as a Tritium Beta Emitting Source.

U.S. patent application Ser. No. 15/859,665 filed on May 8, 2017 and entitled Small Form Factor Betavoltaic Battery for Use in Applications Requiring a Volumetrically-Small Power Source.

U.S. Pat. No. 9,647,299 issued on May 9, 2017 and entitled Small Form Factor Betavoltaic Battery for Medical Implants.

Figure 2:
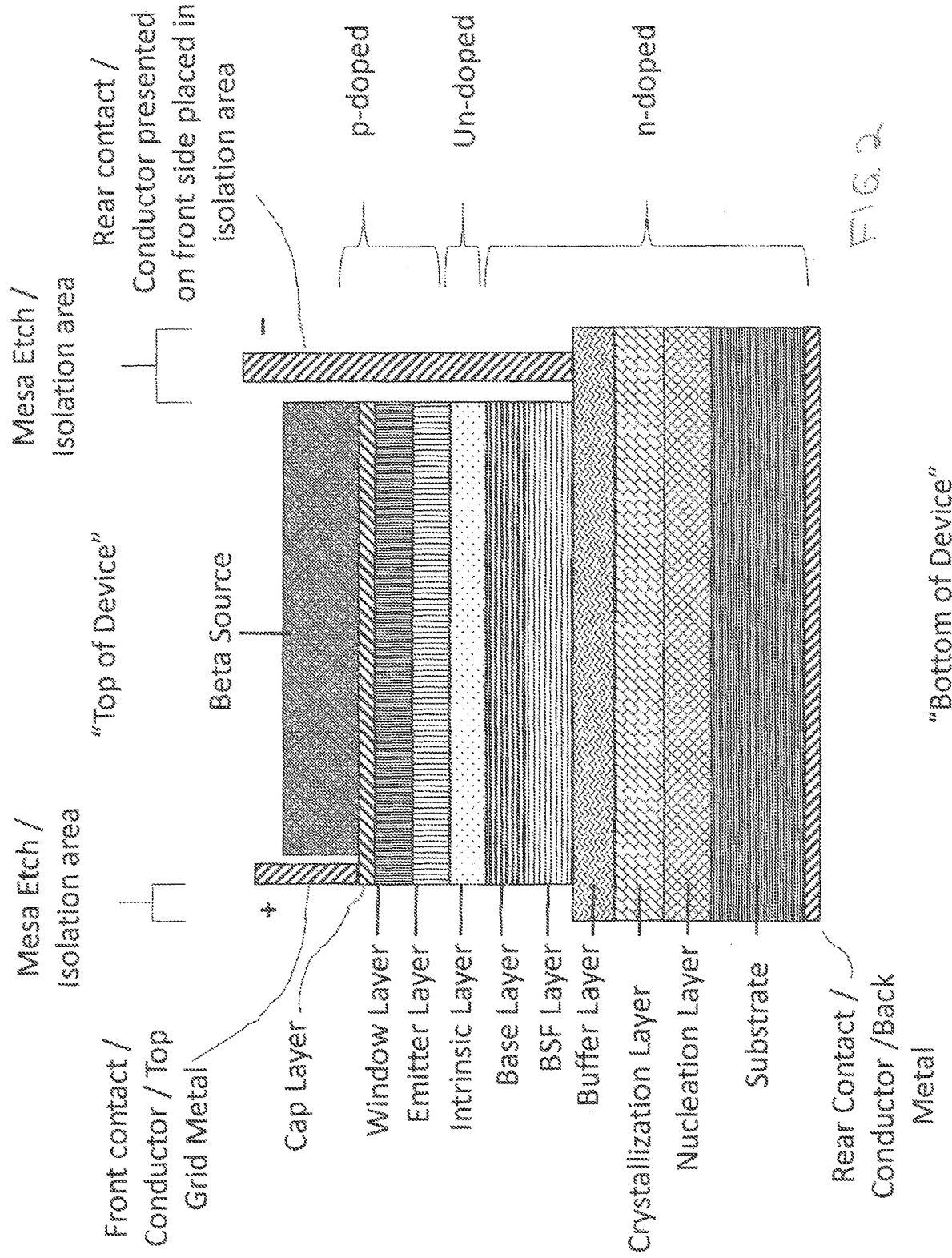

In order to create betavoltaic cells, or units of cells, that have contacts of opposite polarities on at least one of: the front (top) or rear (back) surfaces, it is necessary to etch away small portions of device layers and metalize part of the exposed regions in selected areas to create said contacts. One such configuration is illustrated in FIG. 2 where a positive contact and a negative contact are formed on the top surface. Note that the negative terminal is also available along the rear or bottom surface.

Typically, commonly-practiced chemical etching and lithography processes can be utilized to expose enough material to establish electrical contact with various layers of the device. Etching or removing of layers or portions of layers can also be accomplished using various methods known to those skilled in the art e.g. chemical etching, dry etching, reactive ion etching, metal-assisted chemical etching, laser etching, and/or mechanical/lapidary techniques.

In the case of tritium betas, the junction can be less than 1 µm thick, which is an adequate thickness for the generation of EHPs. The choice of junction thickness is dependent on the isotope selected and the semiconductor junction properties. Generally, in a given junction material, tritium betas travel about a micron, nickel 63 betas travel about three microns, and promethium 147 betas might travel up to 10 microns.

Therefore, the etching depths and layer thicknesses are on the order of nanometers to low microns. In contrast, vias are typically on the order of tens of microns in diameter and are typically produced with an aspect ratio of 15:1. Vias therefore are comparatively costlier in terms of the area they occupy on the cell. In addition to occupying a larger physical space on the cell, the process of creating vias, especially through laser ablation or plasma etching of the substrate, can leave a large swath of area around the via that is unsuitable for betavoltaic use. Vias formed prior to the growth of semiconductor regions act as strong areas for losses through recombination, and vias that are created after growth destroy already-established junction area. In the invention described herein, since vias are not employed, the need for laser ablation or plasma etching is eliminated. Instead a less-invasive standard chemical etch process is preferred to form the contacts.

In the present invention, the terminals/contacts/conductors on the top surface of the betavoltaic cell can be very thin and/or small and may be located on the perimeter of the cell or anywhere that is convenient for stacking purposes. These terminals/contacts/conductors are used to collect the current from the semiconductor while providing a minimal shadowing effect to the radioactive source's beta flux that impinges on the surface of the cell. The terminals/contacts/conductors for the betavoltaic may be formed in the same manner as the solar cell industry uses to make contact gridlines on the solar cell semiconductor. However, the betavoltaic cell terminals/contacts/conductors are substantially different from a solar cell. In a solar cell, sets of gridlines uniformly cover the surface of the semiconductor and can cover approximately 5-10% of the semiconductor surface. This uniform coverage creates a shadowing effect resulting in a proportional loss of power from the solar cell. In contrast, the betavoltaic cell's terminals/contacts/conductors may be reduced to a small footprint. For example, it may be on the perimeter outlining a 1 cm×1 cm cell or 3 cm×3 cm cell, etc. or it may be just a contact point or set of contact points or lines located anywhere that is convenient on the cell's surface. This configuration is possible due to the lower magnitude of current typically collected from the betavoltaic device that is in the nanoamp to microamp per square centimeter range as opposed to solar cells where the range is more in the milliamp per square centimeter range. Thus, whereas solar cells achieve relatively low series resistance (<1 ohm per square centimeter of cell area) by the inclusion of more contact line coverage, betavoltaic cells can function efficiently with much greater values of series resistance.

The conductive contacts on the rear of the betavoltaic cell (FIGS. 1, 2 and 3) can be formed by many techniques known to those skilled in the art. When a conductive substrate is utilized, and a junction is grown on only one side, the junction is the de-facto so-called front side, and the rear contact may be established with blanket deposition of conductive contact materials onto the bottom side of the substrate.

Rear or bottom contacts may also be engineered on the bottom side of the substrate to meet specific requirements and may be in the form of metal contacts/gridlines/rings/terminals/pads/points/epoxy(s)/solders etc. Similar to the betavoltaic cell's top contacts, the rear contact may be formed as a ring and may be reduced to a small perimeter (e.g. outlining a 1 cm×1 cm cell or 3 cm×3 cm cell etc.) or it may be just a set of contact points or lines located anywhere convenient on the cell's surface.

Similarly, a rear contact can be established at any point where access can be gained to a material doped to the type opposite to that of the front contact. Specifically, the front contact is established to the cap layer such that the rear contact may be established with the opposite polarity layers (e.g. buffer, BSF, base, substrate, etc.). FIG. 2 illustrates a case in which a rear contact is presented on the top of the device by contacting the n-type doped buffer layer; in this illustration, front contact is established on the top of the device to the p-type doped cap layer. A portion of the top layers may be chemically etched, physically ablated, or otherwise removed to expose the opposite-doped layers. Conversely, a portion of the substrate may be chemically etched, physically ablated, or otherwise removed partially from the bottom to reach these layers (not shown in FIG. 2). Similarly, the exposed portion may accommodate contacts in the form of metal contacts/gridlines/rings/terminals/pads/points/epoxy(s)/solders etc. It should be noted that this approach described above may be utilized for non-conductive substrates as well.

In any of the embodiments presented herein, device terminals may be introduced on any layer in the betavoltaic cell provided that it is physically accessible or can be accessed through removal of proximal materials by chemical etching, physical ablation, or otherwise removed by methods known to those skilled in the art.

When a substrate is removed entirely, through methods described in the several commonly-owned patent applications and issued patents referenced herein, as well as other techniques known in the art, a rear/bottom contact may be established to the remaining bottom layers, which may include a base, BSF, release layer, buffer, or other layers doped the opposite type to the layer upon which front/top contact is established. These contacts may be formed using any of the methods in the teaching of this invention.

In one embodiment, it is also possible to establish a rear contact through the top side of the betavoltaic device by chemically etching, physically ablating, or otherwise removing the semiconductor material from the top side, down to the metal backing layer contact, thereby leaving a region of backing layer contact accessible from the top side of the betavoltaic device. This is especially applicable to extremely thin cells where the physical thickness is below approximately 50 microns such as those produced by the ELO process, through substrate removal, or other thinning methods known in the art.

In the embodiment illustrated in FIG. 2, a cap layer may be grown to a desired thickness (e.g. cap layer thickness is chosen to optimize beta flux impingement on junction while protecting the window layer from oxidation), and a conductive contact (e.g. metal contacts/gridlines/rings/terminals/pads/points/epoxy(s)/solders etc.) may be placed or deposited on a small area of the cap layer.

Figure 3:
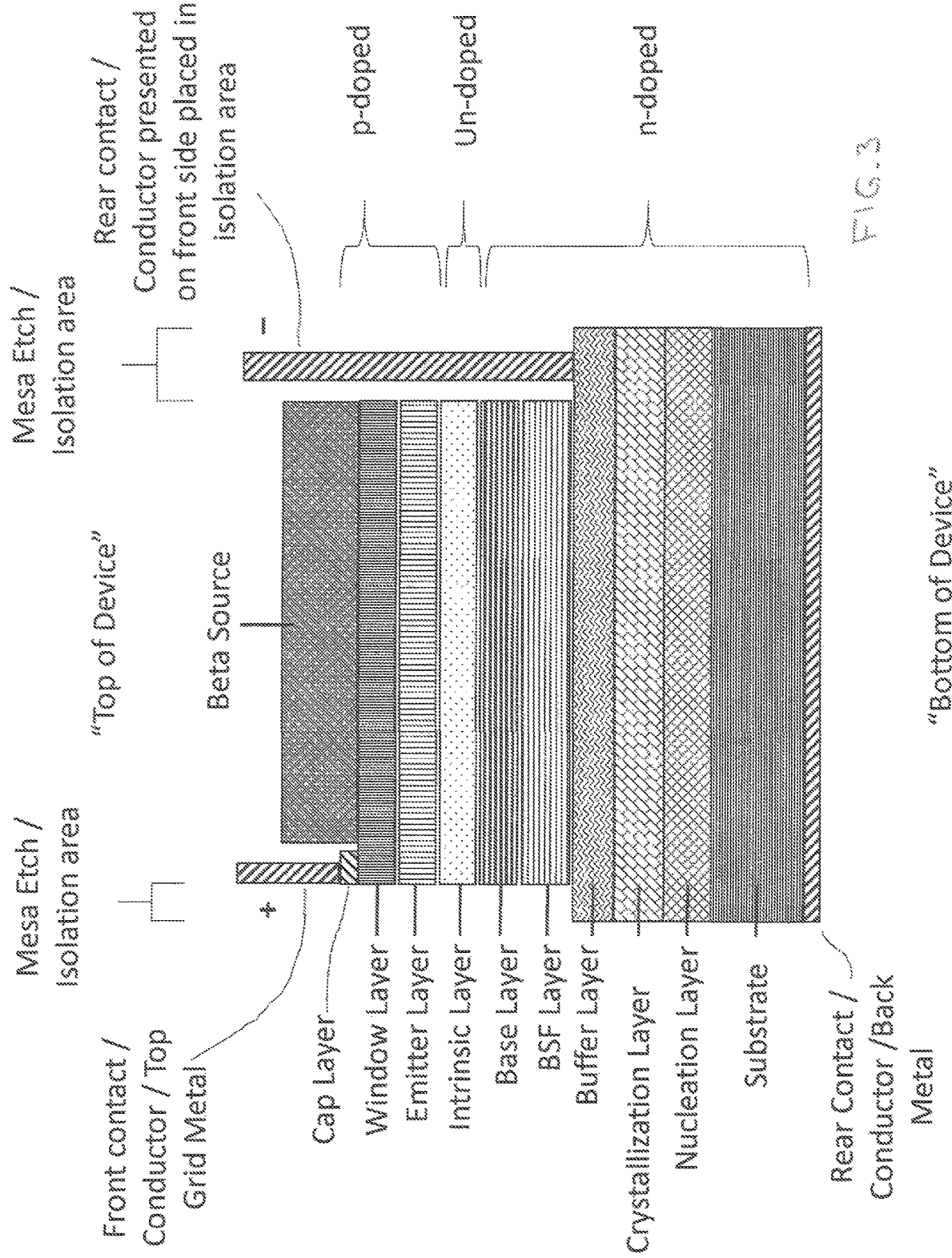

In another embodiment, the cap layer may be chemically etched, physically ablated, or otherwise removed on areas of the device except areas under the conductive contacts. The removal of the cap layer may be partial (resulting in a cap layer thickness that is less than the starting thickness) or complete (i.e. no cap layer remains except under the deposited contacts). Additionally, in some embodiments, the cap layer thickness may vary from location to location. FIG. 3 illustrates the case in which the cap layer is completely removed, except under the contact, and the beta source is placed directly in contact with the subsequently-exposed window layer.

In another embodiment, a cap layer is not grown initially, or is entirely removed prior to deposition of conductive contact(s). In this embodiment, electrical contact is established with either the window or emitter layer using methods known to those skilled in the art.

In a betavoltaic device, the power delivered by a cell is directly proportional to the amount of cell area that is exposed to the radioactive source. This relationship between area and power necessarily means that "active" area is highly valuable and should be maximized in order to generate the most power possible from a single cell. Introduction of through-vias necessarily negatively impacts the available active area of a cell by removing available surface area that would otherwise be devoted to current generation.

In an embodiment of this invention, prior to etching, a mask is applied to cover regions of the semiconductor surface that are not to be removed. In order to prevent a device from shorting, regions of the device are often "isolated" from each other through the use of an etch process (e.g. wet chemical etch, reactive ion etch, etc.) that removes layers of one type such that the "top" of a device is now "isolated" from the bottom of that device as shown in FIG. 1, FIG. 2, and FIG. 3.

To maximize the active area of the device, the etching and contact processes create contacts that sit proximal to, or inside of, the isolation area of the cell, an area that is necessary for device function but is not a device active area. The objective is to design and form contacts in the isolation regions without compromising the active area. FIG. 2 and FIG. 3 illustrate contacts placed inside an isolation area (sometimes called mesa-etch area). As mentioned previously, through-vias are costly in terms of their impact to device active area, their complexity to manufacture, and their deleterious impact to the performance of the device due to defects associated with the via construction.

In one embodiment, contacts are introduced in this isolation area (which is also sometimes referred to as mesa etch, isolation etch, etc.) without affecting the amount of active area on the cell. A typical isolation etching process is designed to remove only layers of opposite dopant type down to a base layer to prevent shorting. With controlled etching (e.g. timed, or through the use of an etch-stop layer) a desired contact layer of opposing polarity may be presented on the front of a cell, and contact may be established to that etch-exposed region. The isolation etch necessarily encircles the entire active area. The isolation and contact arrangement illustrated in the FIG. 1-3 is merely illustrative of one arrangement.

Figure 4:
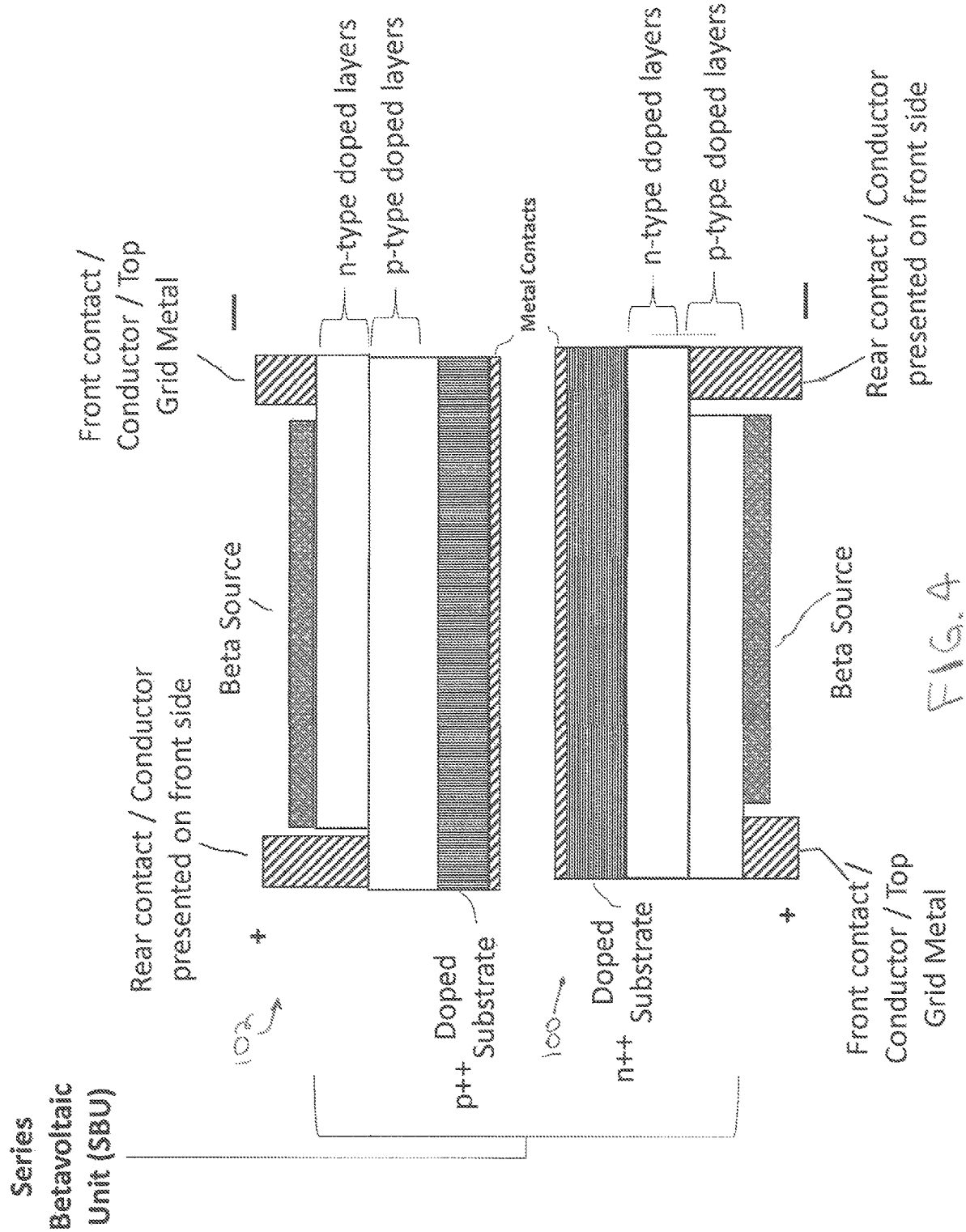
FIG. 4 illustrates a series betavoltaic unit.

One novel configuration, illustrated in FIG. 4, shows the cell or device of FIG. 2 (combined with another cell or device of FIG. 2 that has reversed dopant types) assembled into a series betavoltaic unit (SBU). These two cells or devices (referred to by reference numerals 100 and 102 in FIG. 4) are electrically joined back-to-back through simple contact pressure or other methods known in the art applied to a metal contact associated with each cell or device.

The combination of these two cells, referred to as an SBU, results in the addition of their individual voltages. These units may further be stacked consecutively (e.g. vertically) and electrically interconnected in series or parallel configurations.

Figure 5:
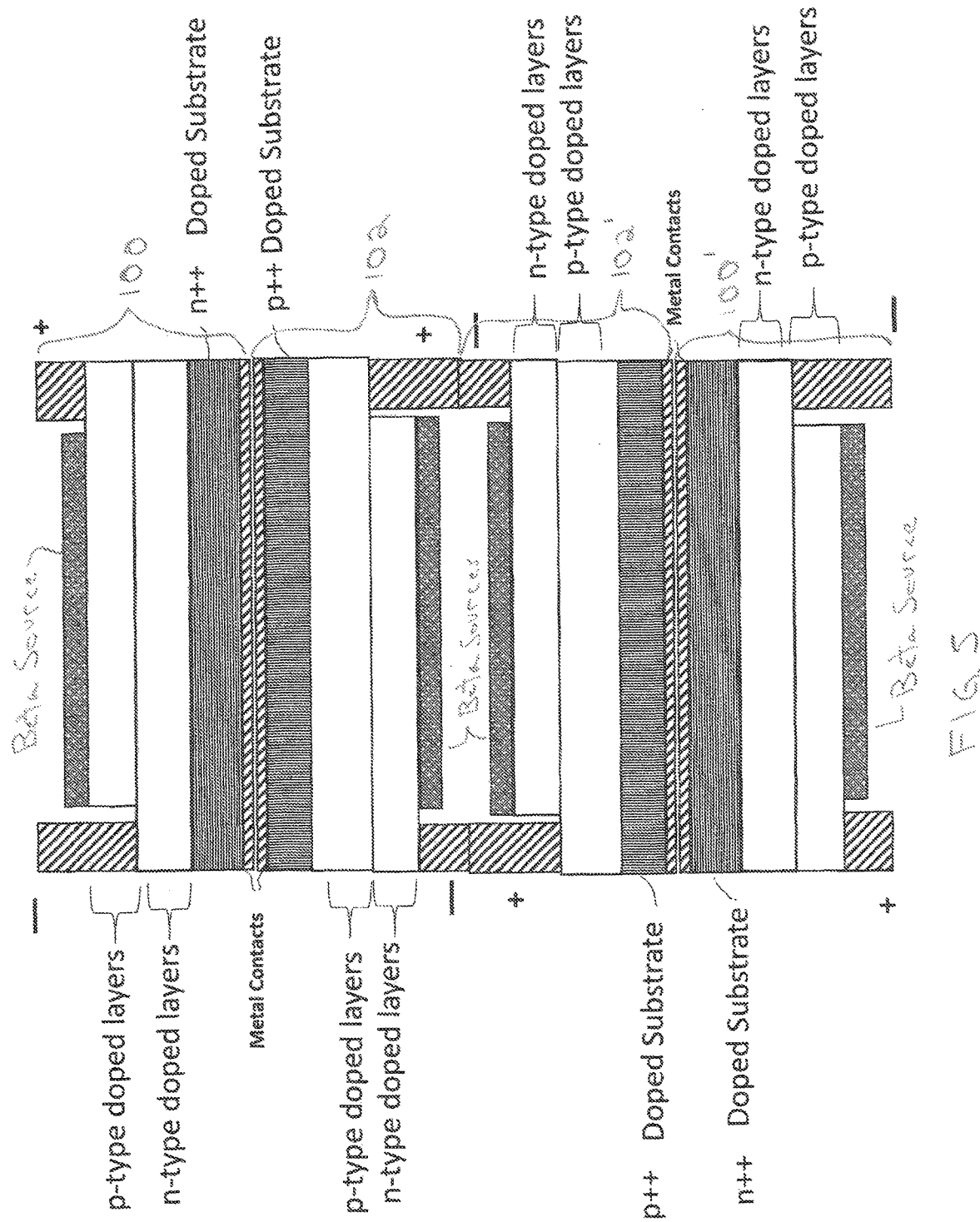
FIG. 5 illustrates two series betavoltaic units of FIG. 4 in series.

FIG. 5 illustrates two SBU's of FIG. 4 in an electrical series configuration. The first SBU comprises the cells or devices 100 and 102 (flipped upside down from the orientation of FIG. 4). The second SBU, comprising cells or devices 100' and 102', is serially connected to the first SBU by connecting a positive polarity contact of the second SBU to a negative polarity contact of the first SBU, and a negative polarity contact of the second SBU to a positive polarity contact of the first SBU. As can be seen, positive and negative polarity contacts are available on opposing surfaces of the device of FIG. 5.

Figure 6:
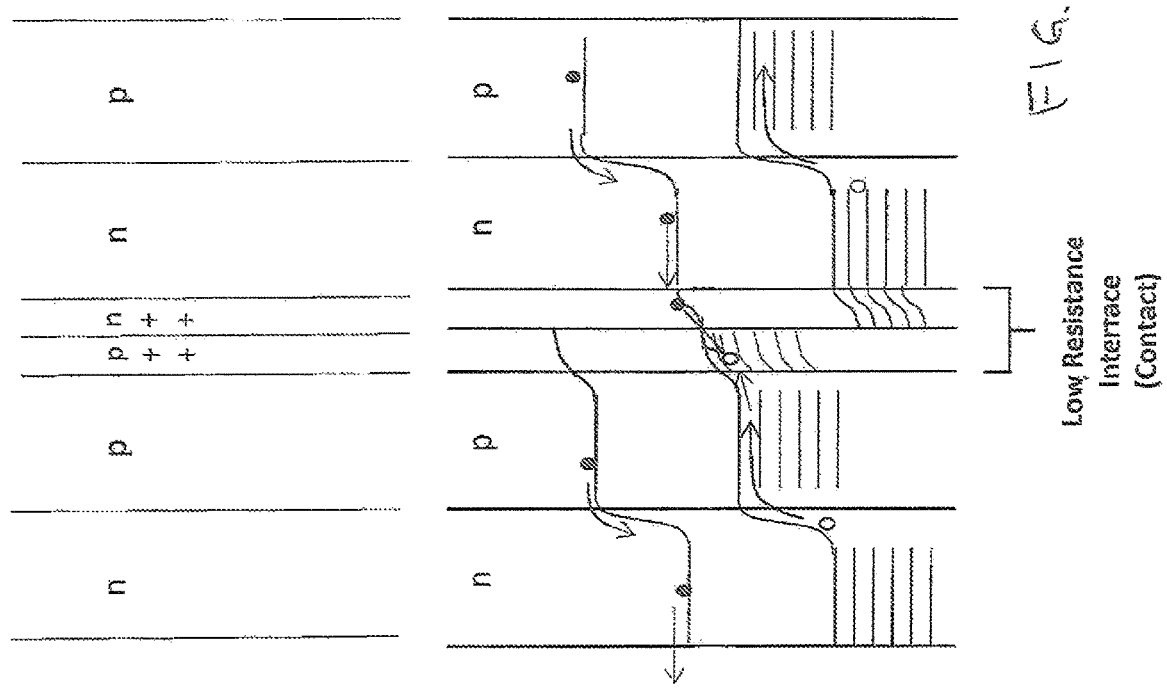
FIG. 6 illustrates a band diagram for a series betavoltaic unit with two contacting highly doped regions.

It should be noted that the SBU inherently contains a tunneling component or tunneling-like structure. This arrangement allows electrons and holes to recombine easily at the interface between the two heavily doped layers of the opposite polarity cells, which in turn allows a current to flow with negligible resistance. FIG. 6 illustrates the band diagram for an SBU with two contacting highly doped regions. Two cells of opposite type configurations (e.g. n/p and p/n) are connected in series with a negligible resistance. Note that the p++ and n++ layers may each be coated with a metal layer to further reduce the interface resistance.

The ability to connect the SBUs in parallel (or series) results from the novel arrangement of the two cells (which comprise the SBU) butted-up back-to-back with both positive and negative contacts on the top side of each cell (FIG. 4). The inventors have determined that by forming both positive and negative terminals on the top surface of each cell, and a terminal on the bottom surface, one of the cells can be "flipped" and the two "bottom" terminals connected. This configuration forms an SBU. This configuration then results in a both a positive and a negative terminal on both exposed surfaces of the SBU. See FIG. 4.

As can be seen in FIG. 4, for example, the required layer configurations to allow this cell "flipping" is accomplished through reversal of the dopant type layers on the bottom cell relative to the dopant type layers on the top cell. For example, with an n/p arrangement on the bottom cell then the top cell requires a p/n arrangement.

When cells are assembled into an SBU, their back-to-back electrical contacts are joined using methods invoking contact pressure, solders, solder bumps, conductive epoxies, ultrasonic bonding, or other methods known to those skilled in the art.

Figure 7:
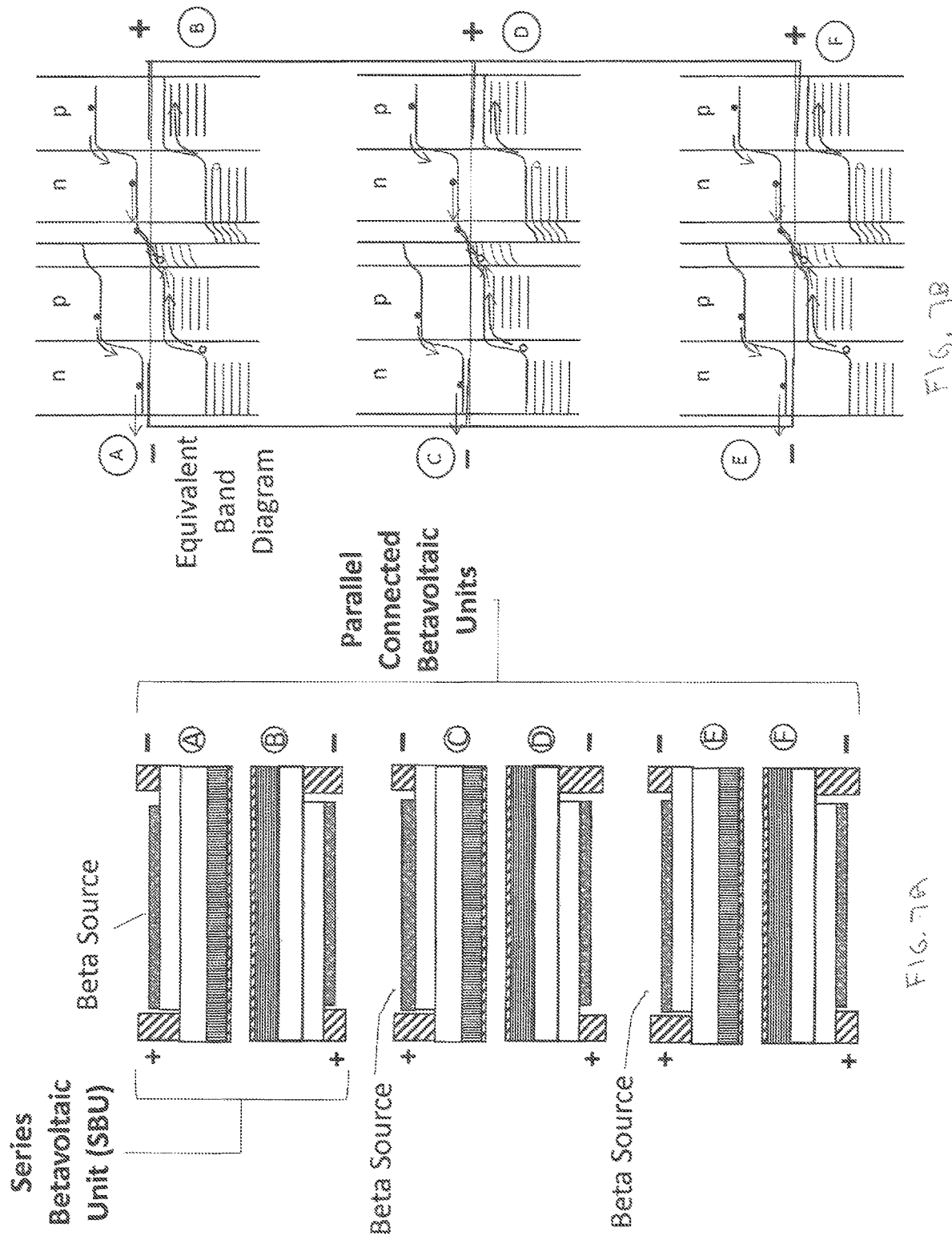
FIG. 7A illustrates a parallel connection of series betavoltaic units of FIG. 4
FIG. 7B illustrates an energy band diagram for the configuration illustrated in FIG. 7A.

One advantageous aspect of this invention allows any combination of series and parallel connections of the SBUs such that a betavoltaic can satisfy any output voltage and current requirement. Such a parallel combination is illustrated in FIG. 7A and the energy band diagram for the configuration illustrated in FIG. 7B. FIG. 7A shows that SBUs, comprised of the configuration in FIG. 4, are consecutively stacked (e.g. vertically), and placed in a parallel configuration. According to other embodiments (not illustrated), the stacked SBUs can be arranged in any number of SBUs and/or configurations, providing customizable series and/or parallel configurations. According to different embodiments of the invention, any number of SBUs can be connected in parallel. In other embodiments, some of the SBUs are configured in a parallel arrangement and others in a series arrangement.

Figure 8:
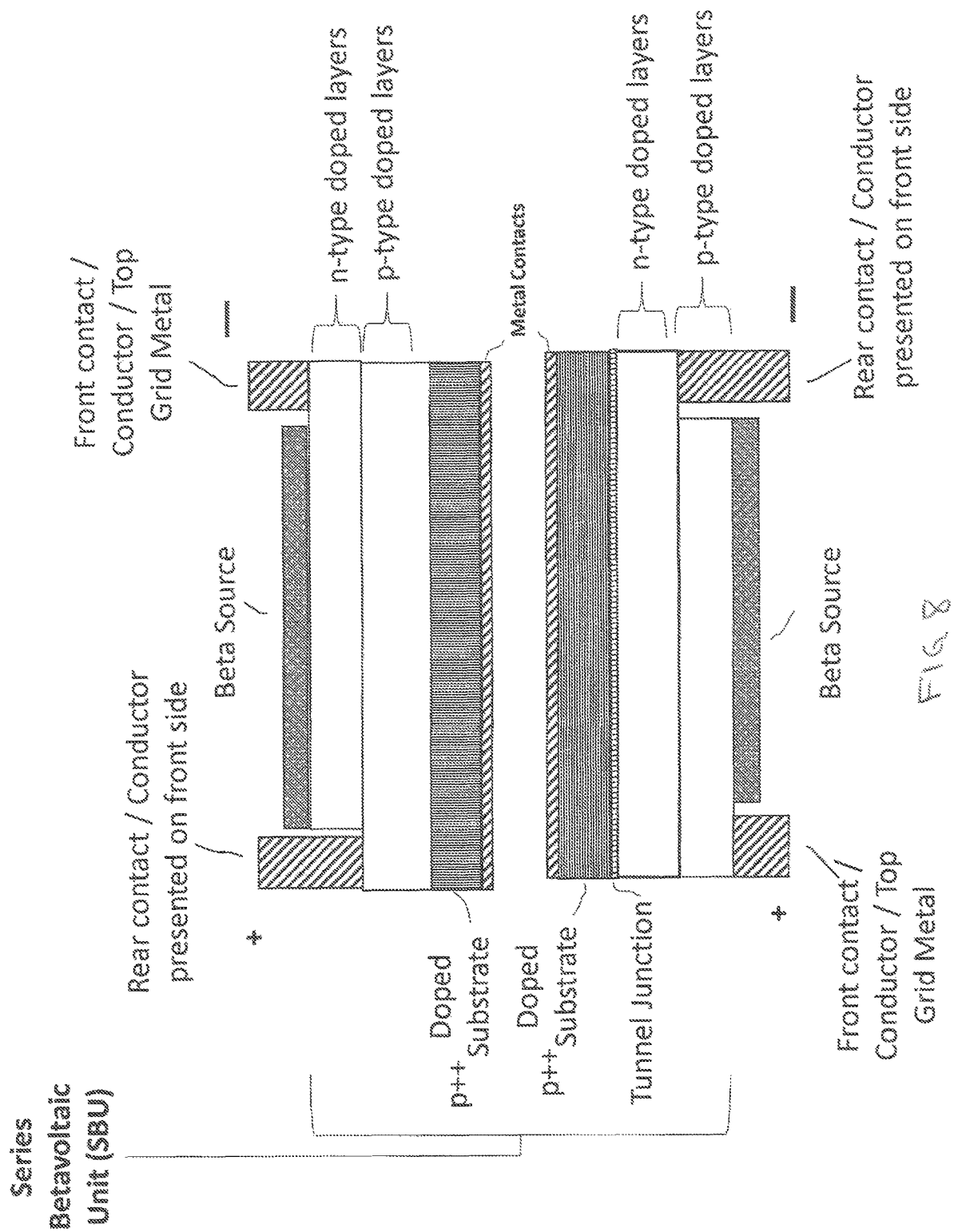
FIG. 8 illustrates an embodiment utilizing the same dopant-type for both substrates of the series betavoltaic unit and a tunnel junction.

In one embodiment, the SBU may utilize the same dopant-type for both substrates through the addition of a tunnel junction or similar structure disposed at the interface between the junction and the substrate with opposite dopant types. For example, In FIG. 8 a tunnel junction in the bottom betavoltaic junction separates the p++ substrate from the n-type layer that is in direct contact. The tunnel junction permits connectivity between the two betavoltaic junctions. In another embodiment, the p++ substrate(s) can be replaced with an n++ substrate(s) if a tunnel junction is utilized between the n++ substrate and the p-type layer directly in contact with said substrate.

Figure 9:
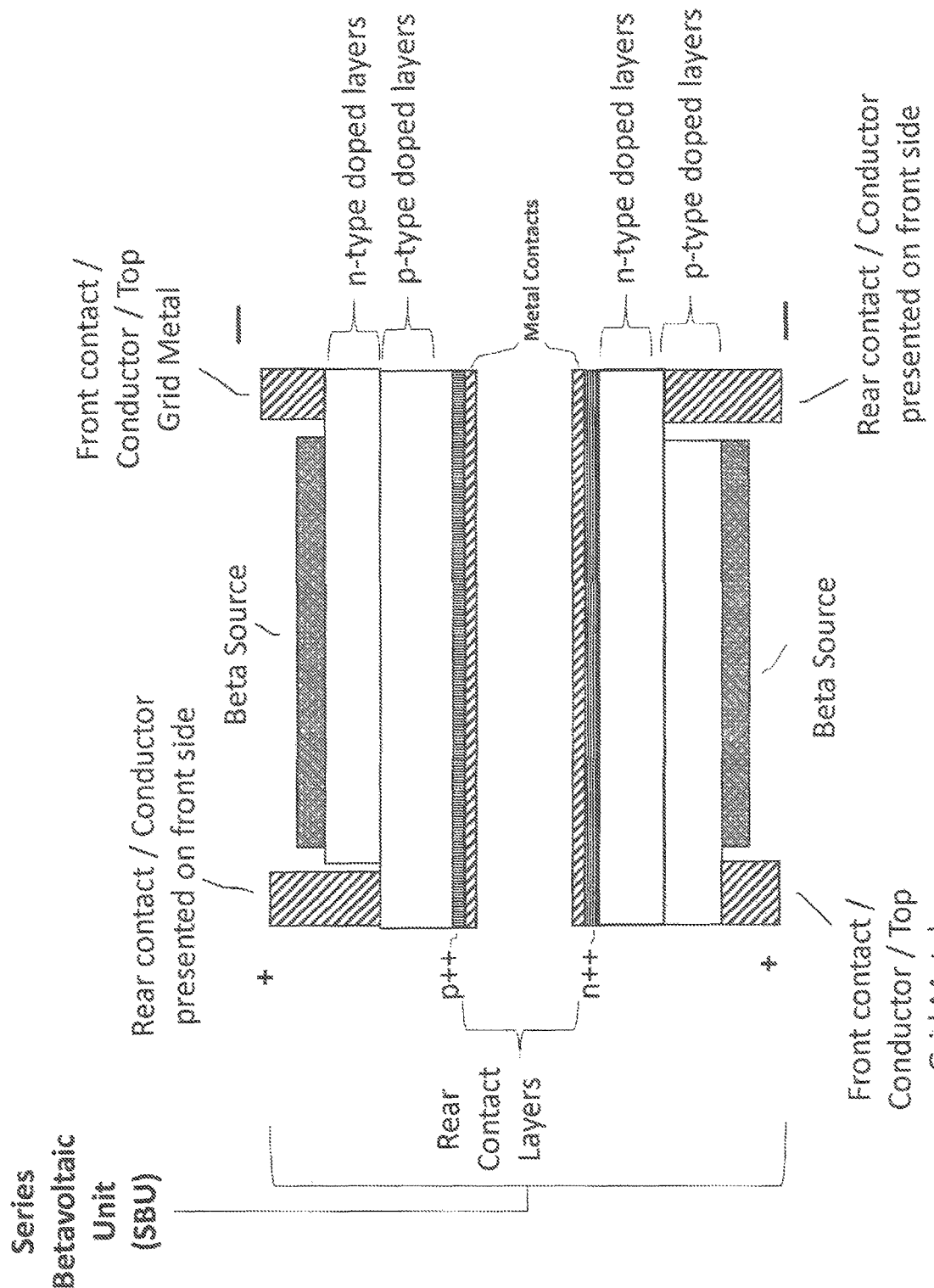
FIG. 9 illustrates an embodiment of a series betavoltaic unit absent substrates.

In one embodiment, the SBU comprises two discrete and opposite semiconductor junction arrangements, each created through the ELO process or substrate-removal process. One arrangement has a p/n structure, from the front/top side to the rear/back side and the other has an n/p structure from the front/top side to the rear/back side. See FIG. 9. Note that in FIG. 9 (as well as FIGS. 4, 7A, and 8) the individual layers are not shown, but instead only the aggregate "n-type doped layers" and the p-type doped layers" are labeled. See FIG. 2 for specific layer details.

Figure 10:
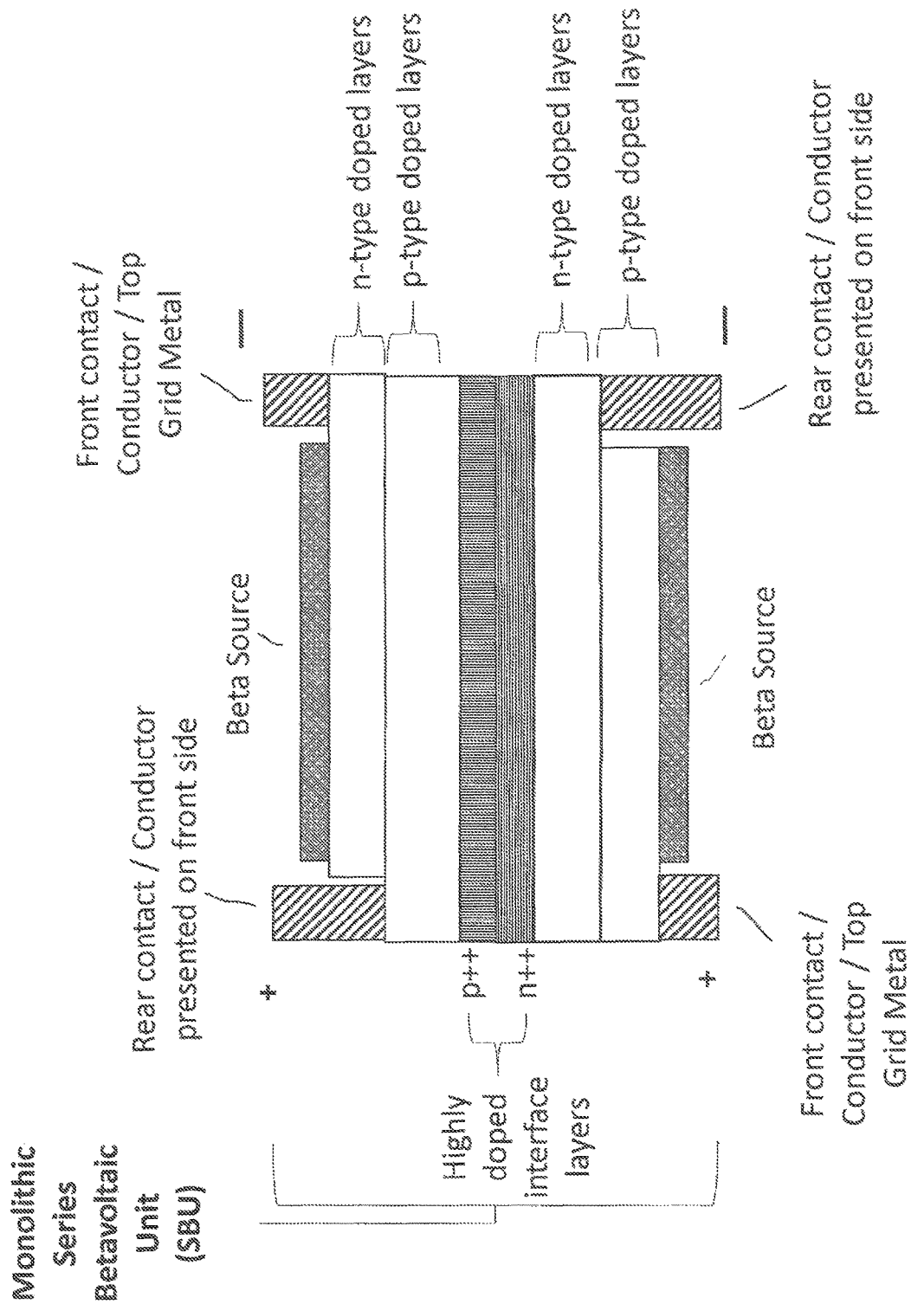
FIGS. 10 and 11 illustrate embodiments of a monolithic series betavoltaic unit.

FIG. 10 illustrates an embodiment where a monolithic SBU is constructed. The SBU may be grown via MOCVD (metal organic chemical vapor deposition) as a double-junction, or via other methods as known in the art. The double junction may be released from the substrate through the ELO process or the substrate-removal process. The interface between the junctions is a continuous region where highly-doped n++ and p++ layers are interfaced with one another (effectively a tunnel junction or similar structure) and serves as the means to electrically connect the devices back-to-back.

Figure 11:
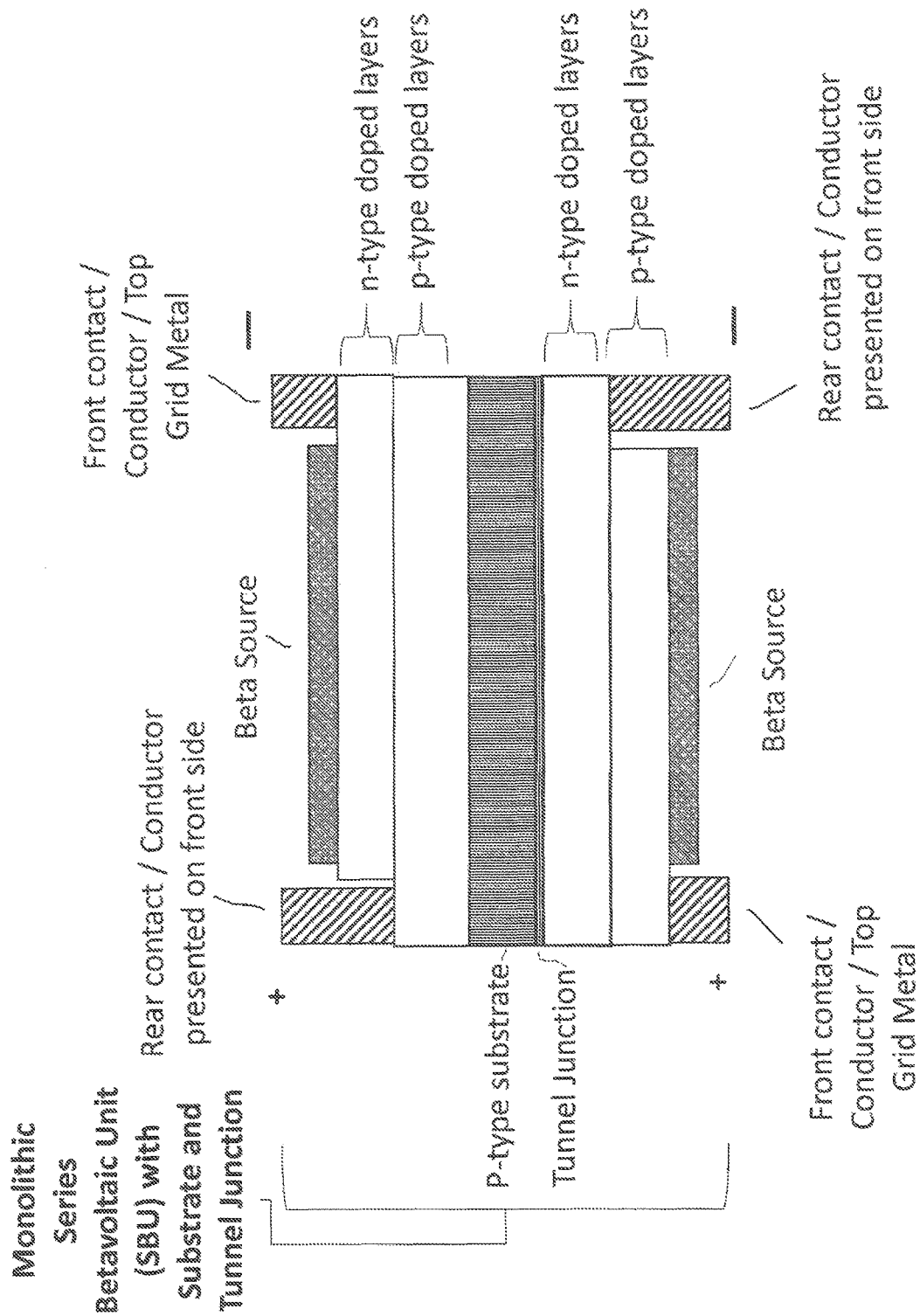

In another embodiment, a monolithic SBU may also be constructed by utilizing two sides of a single substrate (FIG. 11). The top side of the substrate may have an n/p cell, and the bottom side of the substrate may have the opposite (p/n) cell. The cells may be grown through methods known in the art (e.g. MOCVD (metal organic chemical vapor deposition), MBE (molecular beam epitaxy), etc.). The substrate (in combination with a tunnel-junction or similar structure) serves as the interface region for series-connection of the two cells forming the monolithic SBU. Positive and negative contacts are formed on the cells as described in the teaching of this invention.

In another embodiment, due to the nature of some tritium-containing systems, it may be impractical or impossible to deposit the metal hydride on the surface of a semiconductor. Many metal systems will act as dopants for semiconductor materials, and can cause undesirable performance when placed in direct contact with a semiconductor material. As an example, diffusion of a metal with p-type dopant characteristics into an n-type layer can severely degrade the performance of a betavoltaic cell, and for many reasons, the use of a buffer layer may be undesirable. A buffer layer between a beta-emitting source and a semiconductor junction will necessarily absorb many of the beta particles that would otherwise enter the semiconductor junction, thus preventing them from entering said junction and reducing the performance of the cell. In cases where there may be benefits to having the beta source remain separate from the semiconductor, the beta source may be introduced as a foil or a film. The source may be deposited through physical or chemical means on an inert substrate, or it may be included on an interposer or other device that is used both as a carrier for the source, and as a means to provide contact through the betavoltaic layers. These intermediary structures may also be constructed from ceramics, flexible circuit materials (e.g. Kapton, polyamides, etc.), or other materials as known in the art. See FIG. 12.

In all embodiments, the SBU may have just a single source deposited on one surface of one cell in an SBU; since the beta source can radiate bi-directionally and is capable of providing an ample beta flux to the top and bottom cells that are adjacent to the source. FIG. 13A illustrates an embodiment where a single source radiates bi-directionally. FIG. 13B depicts the band diagram for FIG. 13A.

In one embodiment, it is desired for each cell to be impinged-upon by beta particles, otherwise that cell operates as a current sink instead of the desired current source operation.

In any of the embodiments, a functioning device can be made by reversing the dopant types; n-type doped materials become p-type, and similarly, p-type materials become n-type. The reversing of dopant types does not impact the function of the device, and only schematically changes the direction of current flow (the polarity), whereby positive terminals become negative terminals and so forth.

In any of the embodiments, the semiconductor devices can be of a construction that utilizes techniques for patterning or modifying the surface area of a semiconductor cell in contact with a radioisotope in order to increase said surface area and the cell's concomitant power output for a given device volume.

In one embodiment, an alpha-radiation-emitting source can be utilized in lieu of a beta-emitting source, resulting in an alphavoltaic that may make use of one or more of the configurations described herein.

In another embodiment, there may be any combination of radioisotope sources in a single SBU or in an array of SBUs giving rise to combinations of alpha-, beta-, and gamma-voltaics. In cases such as these, the SBUs may be comprised of radiation-hardened multiple-junction cells. It should be noted that some choices of radioisotopes may provide decay products that include radioisotopes that emit the same or different types of radiation energy.

In one embodiment, the source may also be one which emits electrons as a secondary source (e.g. a particle strikes the source and the resultant emission is electrons). In addition, other radioisotopes or combinations of radioisotopes and/or substrates whose end-product is an electron or beta particle that impinges on the semiconductor may be utilized.

The source may also be of a type that is intended to be attenuated to appropriate energy levels through the use of a barrier/filter.

In any of the embodiments above, the beta source can be substituted with an assembly that utilizes a radiation source impinging on a scintillating material for the purpose of generating photons that are captured by the cells. These radioisotope-indirect conversion devices can take the place of the beta source in the device and generate photon emissions as well as transmit radioactive alpha, beta, or gamma emissions that may be captured by the junctions.

In any embodiment, the betavoltaic junction does not have to be limited to a p/n or n/p junction. For example, the junction can be comprised of a Schottky barrier or metal-insulator semiconductor or combination thereof so long as the etched layer where rear contact is established is of opposing polarity to the top layer where a front or top contact is established.

In any embodiment, the etching of portions of layers can be substituted for the creation of a blind via in cases where layer etching may be unfavorable. A blind-via would not pass entirely though a device, but would instead be introduced in one surface for the purposes of making contact to a layer within the structure. The contact introduced on said surface would need to be isolated from the surface layer, and any other layer that might create a short in the cell if it came into contact with the material in the blind-via.

In one embodiment, each SBU is comprised of a number of n/p and/or p/n junctions (e.g. each betavoltaic junction is comprised of a multi-junction structure). For example, each cell in the SBU may be comprised of multiple junctions and there may be multiple series-connected cells that together form a single SBU In any embodiments, the SBU(s) may be comprised of any combination of: homojunctions, heterojunctions, Schottky junctions, thin substrates, thick substrates, single- or double-sided sources. And any array may be comprised of any number of SBU(s) constructed utilizing any combination of the SBU constructions described herein.

In any embodiment, any semiconductor material (e.g. III-V, SiC, diamond, silicon, germanium, etc.) may be utilized in the construction of cells comprising an SBU or in combination with any SBUs described herein.

Various layers are described herein as having a p-type dopant or an n-type dopant. Those skilled in the art recognize that the dopant types can be reversed (n-type doped layers replaced with p-type and p-type doped layers replaced with n-type) and the device will provide the same functionality. Also, certain embodiments have been described as having an intrinsic layer; depending on the dopant types, doping levels, and other factors, this intrinsic layer may not be required in all embodiments.

The ELO (epi layer liftoff) process has been referred to above. In one embodiment, the ELO process is used to create betavoltaic junction cells that are approximately 25 microns or less, but may be as thick as 100 microns or more. Epitaxial growth of the betavoltaic junction is accomplished on a substrate as is known by those skilled in the art (e.g., using MOCVD or MBE). The epitaxial layers comprising the junction may be coated with a "back-metallization." The coating need not necessarily be metal, but is utilized to provide structure to the betavoltaic junction cell as they are "lifted-off" of the substrate. A process is utilized to remove the betavoltaic junction cell from the substrate (e.g. chemical etch, laser ablation, or other methods as known to those skilled in the art). Either prior to or after "lift-off" the betavoltaic junction layers may be mounted on another substrate or a temporary chuck to provide additional rigidity during processing. The lifted-off betavoltaic junction cell may be further processed, tested, diced, or otherwise manipulated prior to final release from the temporary chuck.

See FIGS. 14A (initial fabrication), 14B (lift off), 14C (re-mount and processing), and 14D (release and dicing).

A substrate removal process is also referred to above. In one embodiment, the substrate removal process is used to create betavoltaic junction cells that are approximately 25 microns or less, but may be as thick as 100 microns or more. Epitaxial growth of the betavoltaic junction is accomplished on a substrate as is known by those skilled in the art (e.g. using MOCVD or MBE). The epitaxial layers comprising the junction may be processed in any of the ways that a typical betavoltaic junction cell may similarly undergo. A temporary chuck or substrate is bonded or mounted to the top side of the substrate upon which the betavoltaic junction cells are grown. The substrate is then removed from the betavoltaic junction cell layers through any number of processes (e.g. chemical etch, laser ablation, or other methods as known to those skilled in the art). The betavoltaic junction cell may be further processed, tested, diced, or otherwise manipulated prior to final release demounting from the temporary chuck.

See FIGS. 15A (initial fabrication), 15B (mounted to temporary chuck/substrate removal), 15C (rear processing and release), and 15D (dicing).

In one embodiment, the released cell, resulting from either the ELO, substrate removal process or other substrate thinning process, is coated on opposing faces with a radioisotope material (e.g. tritium hydride metal etc.) so as to allow beta flux to enter through opposing faces of the released cell. This is particularly useful in cases where there is a monolithic SBU with two junctions such as in FIG. 10 where the beta source is on opposing sides of the monolithic SBU.

This written description uses examples to disclose the invention, including the best mode, and also to enable any person skilled in the art to make and use the invention. The scope of the invention may include other examples that occur to those skilled in the art. Such other examples are intended to be within the scope of the claims if they have structural elements that do not differ from the literal language of the claims, or if they include equivalent structural elements with insubstantial differences from the literal languages of the claims.

In addition to the described embodiments and the layers comprising those embodiments, it should be noted that other embodiments of the invention may comprise one or more material layers from one of the described embodiments used with one or more material layers from other ones of the described embodiments.

What is claimed is:

1. A device for producing electricity, comprising:
   a conductive material layer;
   a first plurality of semiconductor material layers stacked on the conductive material layer and each doped a first dopant type;
   a second plurality of semiconductor material layers stacked above the first plurality of semiconductor material layers and each doped a second dopant type;
   a first contact in electrical contact with one of the first plurality of semiconductor material layers or in electrical contact with the conductive material layer;
   a radioisotope source proximate or in contact with an outermost layer of the second plurality of semiconductor material layers;
   a second contact in electrical contact with one of the second plurality of semiconductor material layers; and
   wherein the conductive material layer comprises a conductive metal layer.

2. The device of claim 1 comprising a plurality of external surfaces that bound the device, wherein the first and second contacts are accessible from different external surfaces of the device.

3. The device of claim 2 wherein the different external surfaces comprise opposing surfaces of the device.

4. The device of claim 1 comprising a plurality of external surfaces that bound the device, wherein the first and second contacts are accessible from any external surface of the device.

5. The device of claim 1 comprising first and second opposing external surfaces, wherein the first contact is in electrical contact with the conductive material layer and accessible from the first external surface, wherein the second contact is accessible from the second external surface and in electrical contact with one of the second plurality of semiconductor material layers each doped the second dopant type, and the device further comprising a third contact accessible from the second external surface and in electrical contact with one of the first plurality of semiconductor material layers each doped the first dopant type.

6. The device of claim 1 wherein an outermost layer of the second plurality of semiconductor material layers comprises a contact region extending beyond a boundary of the radioisotope source, the second contact in electrical contact with the contact region.

7. The device of claim 1 wherein the second contact is in electrical contact with an outermost layer of the second plurality of semiconductor material layers, the outer most layer extending over only a portion of an underlying layer of the second plurality of material layers or extending over substantially all of the underlying layer.

8. The device of claim 1 the first and second contacts for connecting the device to a load to supply current to the load.

9. The device of claim 1 wherein the radioisotope source comprises a conductive enclosure enclosing radioactive material, and wherein the radioactive source is in contact with the outermost layer of the second plurality of semiconductor material layers such that the radioisotope source comprises the second contact.

10. The device of claim 1 the second contact comprising one or more contiguous conductive regions, one or more conductive pads, one or one or more conductive lines, the second contact disposed beneath the radioisotope source or disposed outboard of the radioisotope source.

11. The device of claim 1 a portion of the second contact disposed beneath the radioisotope source and having a thickness that permits radioisotopes to pass therethrough.

12. The device of claim 1 the first contact in electrical contact with one of the first plurality of semiconductor material layers and comprising one or more contiguous conductive regions, one or more conductive pads, or one or one or more conductive lines.

13. The device of claim 1 wherein the radioisotope source comprises a beta emitter source further comprising tritium, nickel-63, or promethium-147.

14. The device of claim 1 wherein the first dopant type comprises an n dopant type and the second dopant type comprises a p dopant type, or the first dopant type comprises a p dopant type and the second dopant type comprises an n dopant type.

15. The device of claim 1 further comprising an undoped intrinsic layer disposed between the first and second plurality of semiconductor material layers.

16. The device of claim 1 wherein the radioisotope source comprises one or more of an alpha particle emitter, a beta particle emitter, and a gamma ray emitter.

17. The device of claim 1 further comprising a double junction comprising:
a third plurality of semiconductor material layers stacked on the second plurality of material layers and each doped a first dopant type; and
a fourth plurality of semiconductor material layers stacked on the third plurality of semiconductor material layers and each doped a second dopant type.

18. A device for producing electricity, comprising:
a conductive material layer;
a first plurality of semiconductor material layers stacked on the conductive material layer and each doped a first dopant type;
a second plurality of semiconductor material layers stacked above the first plurality of semiconductor material layers and each doped a second dopant type;
a first contact in electrical contact with one of the first plurality of semiconductor material layers or in electrical contact with the conductive material layer;
a radioisotope source proximate or in contact with an outermost layer of the second plurality of semiconductor material layers;
a second contact in electrical contact with one of the second plurality of semiconductor material layers; and
wherein the conductive material layer comprises a doped substrate doped the first dopant type, the doped substrate further comprising germanium, gallium arsenide, gallium phosphide, silicon, silicon carbide, gallium nitride, sapphire.

19. The device of claim 18 wherein a semiconductor material of a semiconductor material layer comprises indium gallium phosphide, indium aluminum phosphide, a type III-V material, or any combination of indium gallium phosphide, indium aluminum phosphide, and type III-V material.

20. A device for producing electricity, comprising:
a conductive material layer;
a first plurality of semiconductor material layers stacked on the conductive material layer and each doped a first dopant type;
a second plurality of semiconductor material layers stacked above the first plurality of semiconductor material layers and each doped a second dopant type;
a first contact in electrical contact with one of the first plurality of semiconductor material layers or in electrical contact with the conductive material layer;
a radioisotope source proximate or in contact with an outermost layer of the second plurality of semiconductor material layers;
a second contact in electrical contact with one of the second plurality of semiconductor material layers; and
wherein the conductive material layer comprises a doped semiconductor material layer.

21. A device for producing electricity, comprising:
a conductive material layer comprising first and second opposing surfaces;
a first plurality of semiconductor material layers disposed in contact with the first surface and each doped a first dopant type;
a second plurality of semiconductor material layers stacked above the first plurality of semiconductor material layers and each doped a second dopant type;
a radioisotope source proximate or in contact with an outermost layer of the second plurality of semiconductor material layers;
a first contact in electrical contact with the second surface;
a second contact in electrical contact with one of the second plurality of semiconductor material layers; and
a third contact in electrical contact with one of the first plurality of semiconductor material layers.

* * * * *